United States Patent
Raynor

(10) Patent No.: US 10,116,891 B2
(45) Date of Patent: Oct. 30, 2018

(54) IMAGE SENSOR HAVING STACKED IMAGING AND DIGITAL WAFERS WHERE DIGITAL WAFER HAS STACKED CAPACITORS AND LOGIC CIRCUITRY

(71) Applicant: STMicroelectronics (Research & Development) Limited, Marlow, Buckinghamshire (GB)

(72) Inventor: Jeffrey M. Raynor, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 24 days.

(21) Appl. No.: 15/288,470

(22) Filed: Oct. 7, 2016

(65) Prior Publication Data

US 2018/0103226 A1 Apr. 12, 2018

(51) Int. Cl.
*H04N 5/374* (2011.01)
*H01L 27/146* (2006.01)
*H04N 5/378* (2011.01)

(52) U.S. Cl.
CPC ..... *H04N 5/3742* (2013.01); *H01L 27/14609* (2013.01); *H01L 27/14623* (2013.01); *H01L 27/14634* (2013.01); *H01L 27/14636* (2013.01); *H01L 27/14643* (2013.01); *H04N 5/378* (2013.01)

(58) Field of Classification Search
None
See application file for complete search history.

(56) References Cited

U.S. PATENT DOCUMENTS

| | | | |
|---|---|---|---|
| 2007/0285544 A1 | 12/2007 | Yamada et al. | |
| 2010/0276572 A1* | 11/2010 | Iwabuchi | H04N 5/2253 250/208.1 |
| 2014/0008520 A1 | 1/2014 | Raynor | |
| 2014/0077063 A1* | 3/2014 | Cho | H01L 27/14618 250/208.1 |
| 2017/0272677 A1* | 9/2017 | Shishido | H04N 5/3742 |
| 2017/0301717 A1* | 10/2017 | Kudoh | H01L 27/14643 |
| 2017/0359542 A1* | 12/2017 | Bairo | H04N 5/378 |
| 2018/0020172 A1* | 1/2018 | Hirota | H04N 5/3559 |

* cited by examiner

*Primary Examiner* — James Hannett
(74) *Attorney, Agent, or Firm* — Crowe & Dunlevy

(57) ABSTRACT

An electronic device disclosed herein includes a first integrated circuit die having formed therein photodiodes and readout circuitry for the photodiodes, with the readout circuitry including output pads exposed on a surface of the first integrated circuit die. A second integrated circuit die has formed therein storage capacitor structures for the photodiodes and digital circuitry for performing image processing on data stored in the storage capacitor structures, with the storage capacitor structures including input pads exposed on a surface of the second integrated circuit die. The first and second integrated circuit die are in a face to face arrangement such that the output pads of the first integrated circuit die face the input pads of the second integrated circuit die. An interconnect couples the output pads of the first integrated circuit die to the input pads of the second integrated circuit die.

33 Claims, 16 Drawing Sheets

IMAGE SENSOR HAVING STACKED IMAGING AND DIGITAL WAFERS WHERE DIGITAL WAFER HAS STACKED CAPACITORS AND LOGIC CIRCUITRY

TECHNICAL FIELD

Disclosures herein relate to image sensors and layouts therefor that reduce area for a given pixel size.

BACKGROUND

Digital photography has overtaken traditional film based photography as the routine means by which images are taken and stored. Initially confined to single purpose camera devices, over time digital cameras incorporated into cellular phones grew increasingly popular, and at the present time, the majority of digital images captured by individuals for non-commercial purposes are captured using a digital camera incorporated within a cellular phone. Accordingly, as the desire for cellular phones capable of acting as digital cameras grew, the desire for the digital images captured by those cellular phones to be of higher quality grew.

For years, the image sensors used within the digital camera systems of cellular phones increased in resolution (i.e. pixel count), with top of the line cellular phones incorporating image sensors having more than 16 million pixels (MP), and in one case, over 40 MP.

This increase in resolution was accomplished in part by shrinking the size of individual pixels. This in turn results in each pixel having a reduced charge storage capacity, which means that each pixel captures less light. Since the maximum signal to nose ratio is a function of the square root of the charge storage capacity, these smaller pixels ultimately result in a worse signal to noise ratio.

Consequently, the trend to greater numbers of smaller pixels began to reverse, and the current trend is toward smaller numbers of larger pixels. Since image sensors for cellular phones are desired to be small and compact, the challenge is therefore to design sensors with larger pixels, yet keep the sensor size as compact as possible.

Due to this challenge, rolling blade operated type pixels are commonly employed instead of global shutter operated pixels, due to the traditionally smaller area occupied by rolling blade shutter pixels. However, as will be explained, rolling blade shutter pixels have drawbacks compared to global shutter pixels.

In a rolling blade shutter, an array of pixels are processed line by line, with one being integrated and another being read out for each movement of the shutter. The shutter moves over the array so that the pixels are exposed for the same amount of time, but not at the same time. A rolling blade shutter may not work well when taking images of fast moving objects, such as fans, helicopter blades, or propellers.

With a global shutter, the pixels of the array are simultaneously released from reset and start to integrate simultaneously. Resultantly, the drawbacks of a rolling blade shutter are not present. After a specific period, the pixels are then read out simultaneously into a temporary storage, which may be located inside the pixel. This temporary storage is then scanned out row by row where the signal is amplified or converted into a digital value.

Since the pixels integrate simultaneously, each pixel has at least one dedicated storage capacitor. The various challenges involved in the design of these storage capacitors result in the consumption of an undesirable amount of surface area. So as to make global shutters more size competitive with rolling blade shutters, new designs are desired.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device disclosed herein includes a first integrated circuit die having formed therein photodiodes and readout circuitry for the photodiodes, with the readout circuitry including output pads exposed on a surface of the first integrated circuit die. A second integrated circuit die has formed therein storage capacitor structures for the photodiodes and digital circuitry for performing image processing on data stored in the storage capacitor structures, with the storage capacitor structures including input pads exposed on a surface of the second integrated circuit die. The first and second integrated circuit die are in a face to face arrangement such that the output pads of the first integrated circuit die face the input pads of the second integrated circuit die. An interconnect couples the output pads of the first integrated circuit die to the input pads of the second integrated circuit die.

Also disclosed herein is an electronic device including a first integrated circuit die having formed therein at least one photodiode and readout circuitry for the at least one photodiode. A second integrated circuit die is in a stacked arrangement with the first integrated circuit die and has formed therein at least one storage capacitor associated with the at least one photodiode. An interconnect is formed between the first and second integrated circuit dies for coupling the readout circuitry to the at least one storage capacitor.

DETAILED DESCRIPTION

One or more embodiments of the present disclosure will be described below. These described embodiments are only examples of the presently disclosed techniques. Additionally, in an effort to provide a concise description, all features of an actual implementation may not be described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

This disclosure is directed to a layout and structure for cells of an image sensor utilizing a global shutter, in which digital and analog portions of the circuit are on separate IC's, providing multiple benefits, both in terms of performance as well as space savings. This will be described in detail below, but first a potential pixel architecture to use in this layout will be described. It should be noted, however, that any pixel suitable for use with a global shutter may be used in this layout. In fact, pixels suitable for rolling shutter may also in some cases be used with this layout.

Figure 1A:
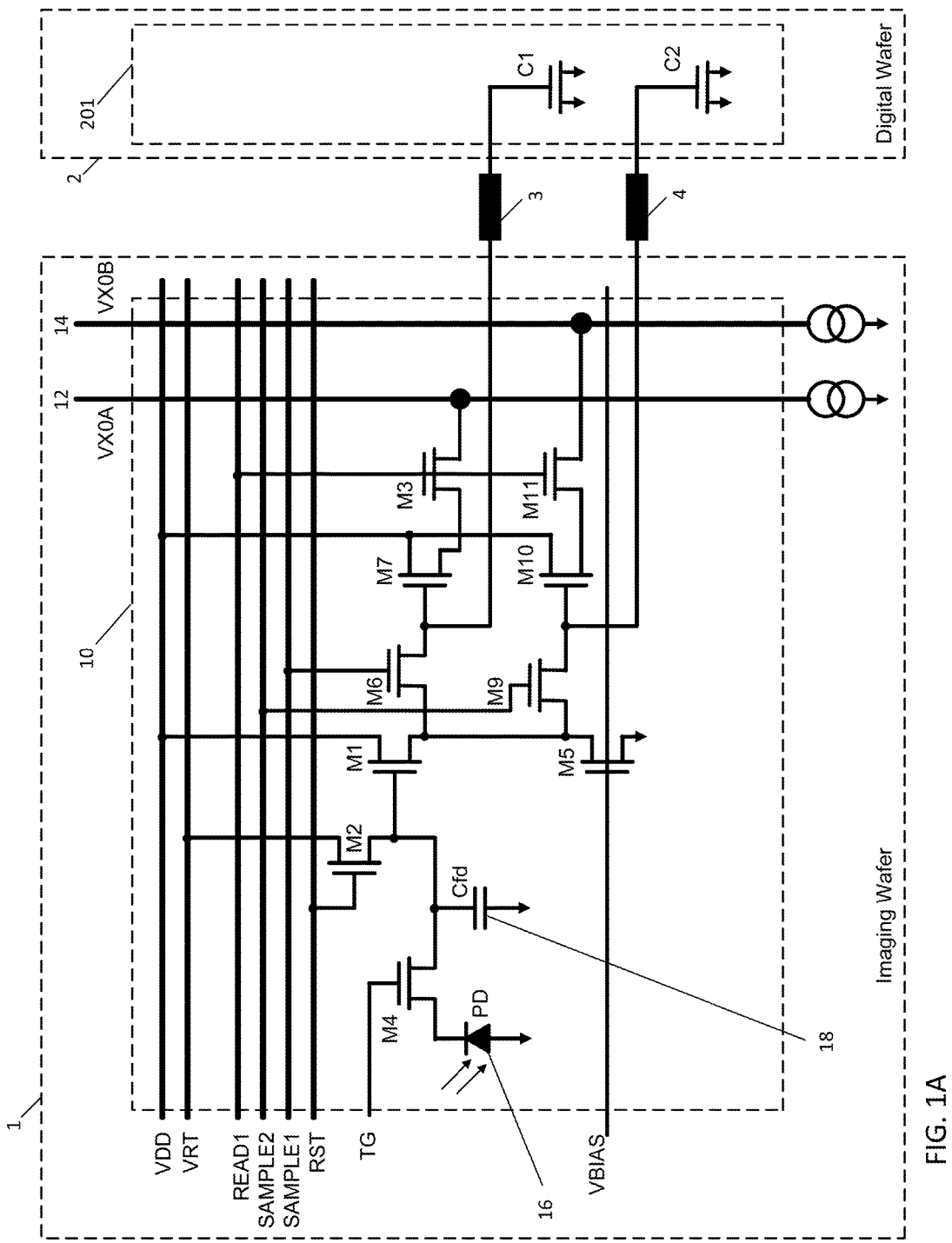
FIG. 1A is a circuit diagram of a ten transistor pixel architecture circuit in which the analog portion of the circuit is on a first integrated circuit die (IC) and the digital portion of the circuit is on a second integrated circuit die (IC), in accordance with this disclosure.
Figure 2:
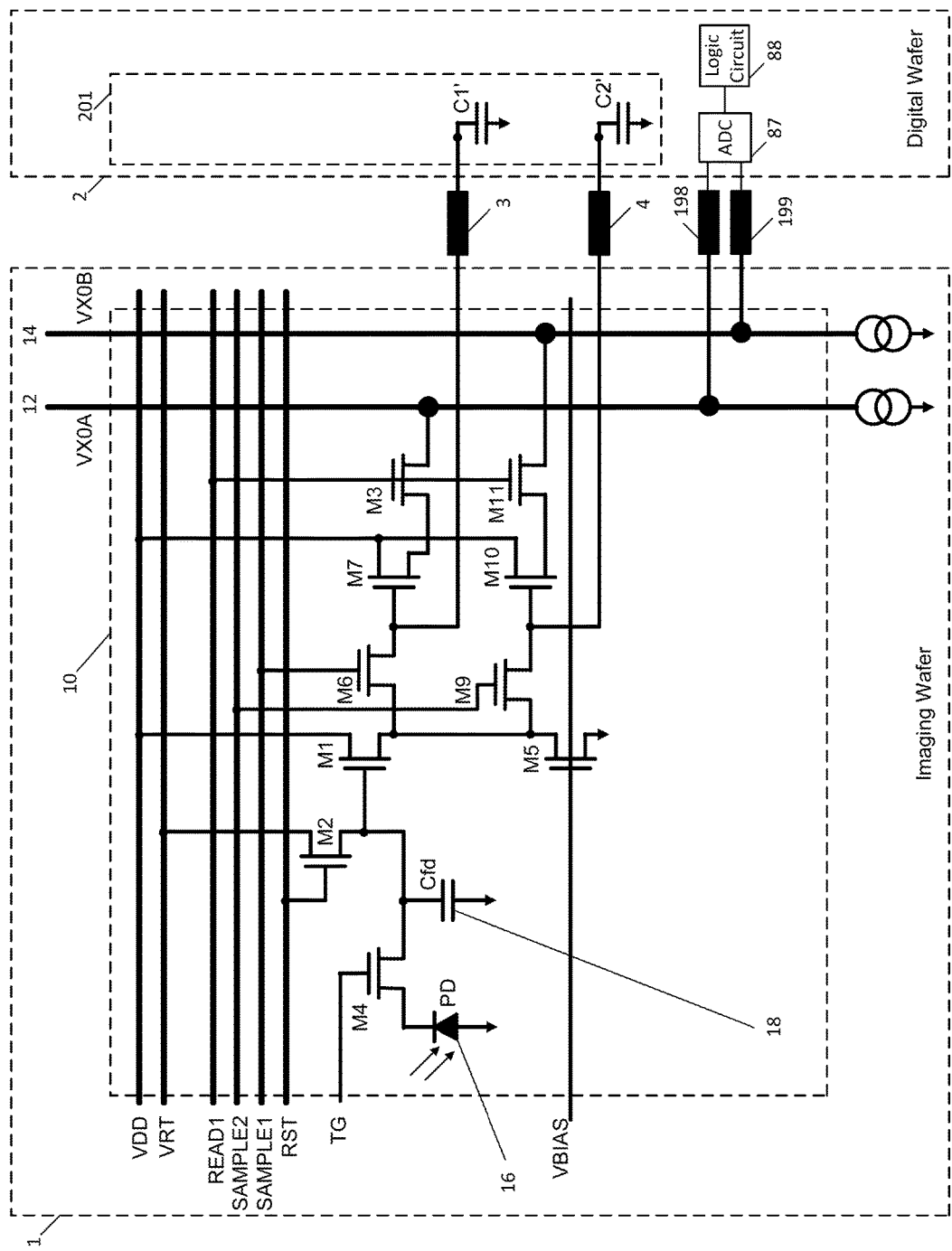
FIG. 2 is a circuit diagram of a ten transistor pixel architecture circuit similar to that of FIG. 1 but with MIM storage capacitors instead of MOS storage capacitors, in accordance with this disclosure.

Referring to FIGS. 1A and 2 the pixel architecture 10 will now be described. This is a ten transistor pixel with two output bit lines. The circuit 10 includes a number of transistors M1 to M11, the functions of which will be set out in more detail below. It should be noted that the capacitors C1 and C2 are shown in FIG. 1A as being MOS transistors configured to act as capacitors, but may also be metal-insulator-metal capacitors. The circuit also includes two output bit lines 12 and 14, a photodiode 16, and a floating diffusion capacitor 18. The circuit includes input and output lines (VDD, VRT, TG, VBIAS, READ1, SAMPLE1, SAMPLE2 and RESET).

M1 is a source-follower where the voltage on the source of M1 follows the voltage on the gate of M1. M2 is used to reset the floating diffusion capacitor 18 and if TG is high, the photodiode 16 is also reset if RST is simultaneously asserted. M3 is a read transistor and is enabled when the signal from the corresponding row is required. It is disabled when another row in the sensor is being accessed.

M4 is a transfer gate transistor to transfer charge during pixel reset from VRT to the photodiode and during pixel readout from the photodiode to the floating diffusion node. M5 is an active load for M1 to help ensure it operates correctly. To save power, it is possible to pull VBIAS low when the pixels are not being read out so that M1 is not used. Transistor M6 is used as a switch and when enabled, allows the voltage at the source of M1 to be stored on the capacitor C1. As stated, C1 can be a metal-metal capacitor (as shown in FIG. 2), but as the capacitor is storing a voltage and not a charge and is followed by a source-follower transistor (M7), it does not need to be linear and hence the gate of a MOS transistor can be used as the capacitor (as shown in FIG. 1A). M7 is a source follower for the voltage on the storage node C1.

M9 provides the same functionality as M6, but for a second storage site. M10 provides the same functionality as M7, but for the second storage site. M11 provides the same functionality as M3, but for the second storage site. C2 can be a metal-metal capacitor (as shown in FIG. 2) or metal-metal capacitor (as shown in FIG. 1A) and provides the same functionality as C1, but for the second storage site.

In the prior art there are architectures which include two capacitors or storage devices. The control of storage to, or read out from, the capacitors does not enable two separate images to be handled separately. In addition, there is an effect from the first storage device on the second storage device (and vice versa) when storing and reading due to charge sharing and the like.

The circuit 10 overcomes these issues by writing to and reading from each storage element independently. The two storage elements C1 and C2 are each written to respectively at first and second times, which times correspond to the successive frames captured.

As shown, the capacitors C1 and C2 are formed within a digital integrated circuit (IC) 2, with the remainder of the circuit 10 being formed within an analog integrated circuit (IC) 1. The analog IC 1 and the digital IC 2 are coupled via conductive bumps 3, 4, as shown. The analog IC 1 and digital IC 2 are formed as separate, distinct ICs. The analog IC 1 does not contain storage capacitors C1, C2 used for sample and hold purposes, and the digital IC 2 does not contain transistors configured to perform analog functions of the pixel. The digital IC 2 may, and in some applications does, contain transistors arranged into logic gates and configured to perform logic functions. Also, in some applications, the digital IC 2 may contain transistors arranged into an analog to digital converter configured to convert the values stored in the capacitors 1, 2 into digital format. It should be understood that any transistor shown on analog IC 1, as well as any structure that performs an equivalent function, is not integrated on or in the digital IC 2. Likewise, any sample hold capacitor or logic circuit shown on digital IC 2, as well as any structure that performs an equivalent function, is not integrated on or within the analog IC 1.

As shown in FIG. 2, an analog to digital converter (ADC) 87 may be integrated in the digital IC 2, and serves to receive voltages from the storage capacitors C1, C2 representing image data. The ADC converts these voltages into the digital domain, and passes the digital values to logic circuit 88 for processing.

Figure 1B:
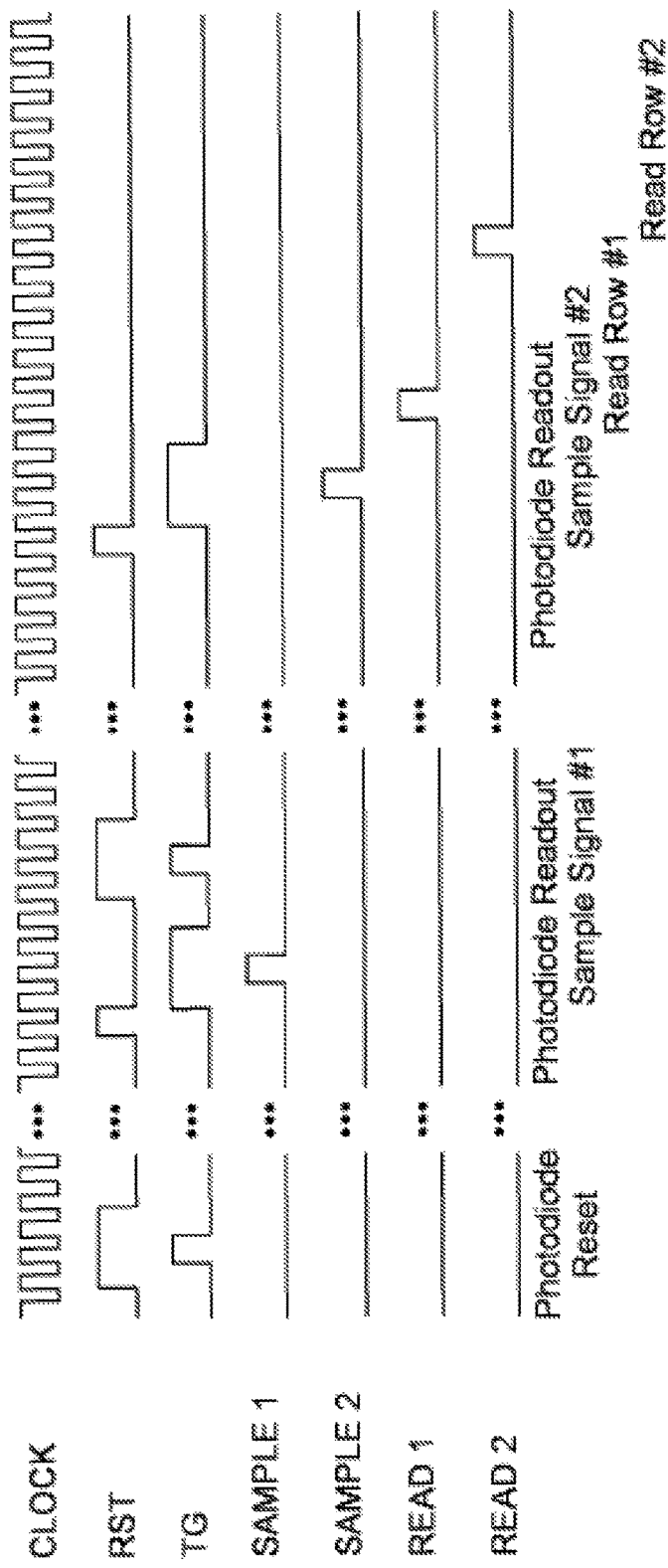
FIG. 1B is a timing diagram of the circuit shown in FIG. 1A.

Operation of the circuit 10 can be seen in FIG. 1B. This sequence captures two images and then reads the images out. The two images may be one with ambient and LED illumination and one with ambient illumination, or may be two subsequent images.

The first operation is to reset the photodiode. This is done by pulsing TG (transfer gate) high while the RESET is high. The system then waits an appropriate period of time (variously called exposure time, integration time or shutter time) and then the signal on the photodiode is sampled and voltage corresponding to the intensity of the signal is stored. This is accomplished by first resetting the floating diffusion node 18 in FIG. 1 by pulsing RESET with TG low. The photo-generated charge from the photodiode is transferred to the floating diffusion node 18 by pulsing TG and this charge is converted to a voltage by the capacitance of the floating diffusion capacitor 18. The voltage is buffered by the source follower M1. The signal is stored on the first sampling capacitor (C1) by enabling the switch transistor M6 by pulsing SAMPLE1 high.

At this point in time, the signal from the first frame has been stored and the photodiode is reset again. The system then waits an appropriate period of time and the second frame and the photo-generated charge is then read out in a similar manner, except that this time the signal is stored on the second sampling capacitor (C2) by enabling the switch transistor M9 with a high logic level pulse SAMPLE2.

Two images have now been independently acquired and stored in all the pixels in the array. Each of the two images may then be read out independently and optionally converted to a digital signal. Typically this is done row by row by pulsing high the READ signal of each row of the array sequentially.

As will be understood by those of skill in the art, a global shutter pixel with two sample/hold capacitors, as described above, can operate in one of two GS modes, namely correlated device sampling (CDS) and high dynamic range (HDR).

In CDS mode, one capacitor is used to sample a reset voltage (preferably just before the signal is transferred from the pinned photodiode PD to the sense node) and the second capacitor is used to sample a signal voltage (shortly after the reset voltage is sampled and stored, the signal is transferred to the sense node). Both these two signals contain the same amount of "kTC" (thermal) noise and so by subtracting these two signals, the kTC noise will be cancelled. The kTC noise can be represented mathematically as:

$$V_{kTC} = \text{SQRT}\left(\frac{kT}{c}\right)$$

As shown, there are three capacitors in the 10 T pixel of FIG. 2 for example, namely Cfd, the sense node capacitor, C1, the first sample hold capacitor, and C2, the second sample hold capacitor.

Hence, the noise on C1 will be the sum of the kTC noise of the sense node, and C1 and C2 will be the sum of the kTC noise on the sense node and C2. The kTC noise sum is thus calculated as:

$$V_{ktCnoise1} = \sqrt{\left(\left(\frac{kT}{Cfd}\right)^2 + \left(\frac{kT}{C1}\right)^2\right)}$$

$$V_{ktCnoise2} = \sqrt{\left(\left(\frac{kT}{Cfd}\right)^2 + \left(\frac{kT}{C2}\right)^2\right)}$$

Hence subtracting the two signals will cancel out the kTC noise on the sense node, but add the kTC noise on the sample/hold signals.

$$V_{ktCdifference} = \sqrt{\left(\left(\frac{kT}{C1}\right)^2 + \left(\frac{kT}{C2}\right)^2\right)}$$

In HDR mode, it is possible to expose the pixel to light twice, for different exposure times and store two different exposures. This can be mathematically represented as:

$$V_{Swing1} = I_{photo} \times \frac{t_{int1}}{Cfd} \pm V_{kTCnoise1}$$

$$V_{Swing2} = I_{photo} \times \frac{t_{int2}}{Cfd} \pm V_{kTCnoise2}$$

The $V_{Swing}$ voltages are the change on the sense node from the reset voltage, where $V_{kTCnoise1}$ and $V_{kTCnoise2}$ are the noises shown above. However as the sense node is reset between each exposure, the noise on the sense node is different and a separate sampling of the reset noise is used for each case. To implement this, 4 S/H capacitors are used for each pixel.

It is thus possible, and in some cases desirable, to modify the invention to have four sample/hold capacitors. The four capacitors can then be used to store two image values and two reset values so that CDS can be performed on each of the acquired images.

Figure 3:
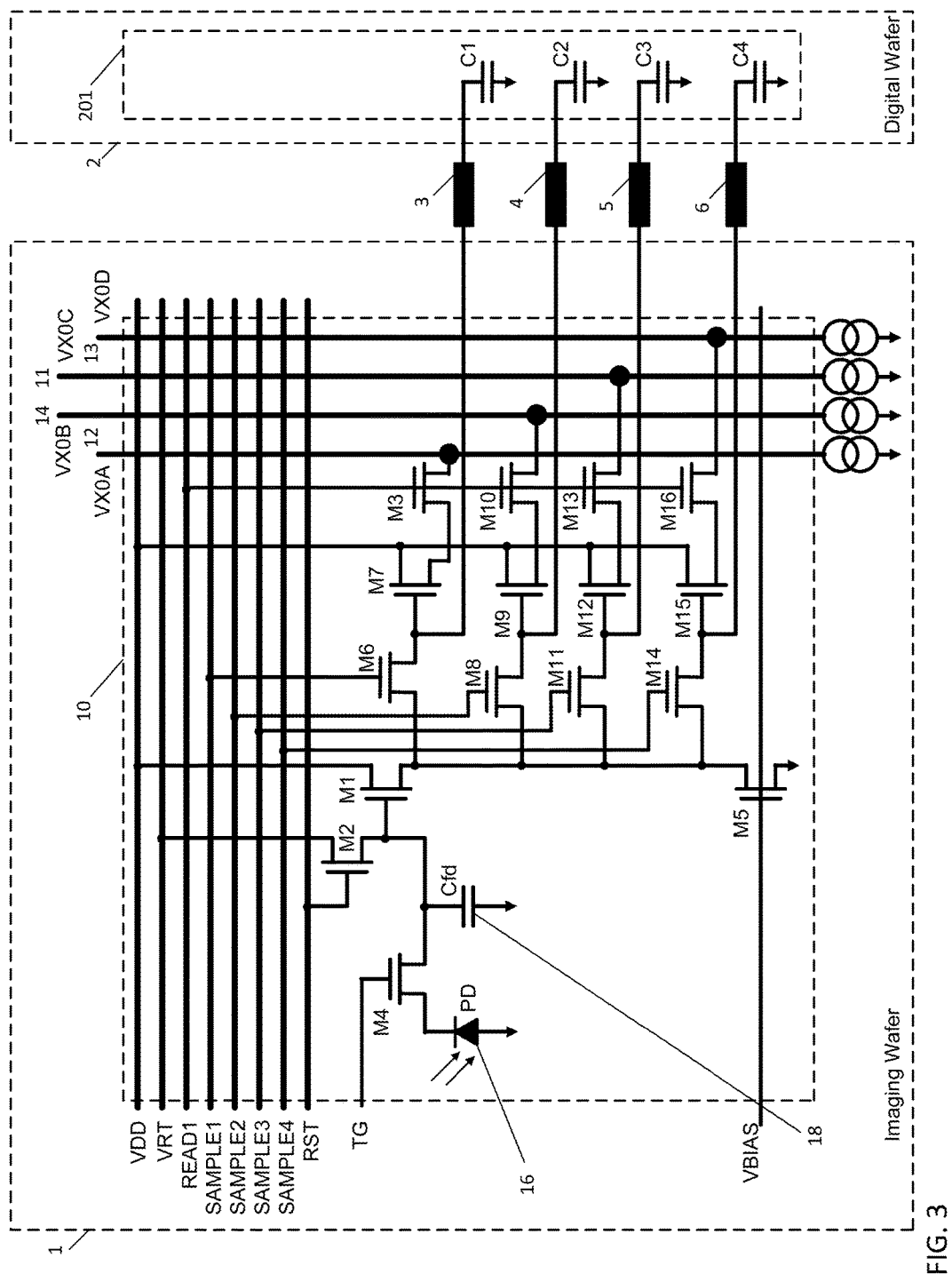
FIG. 3 is a circuit diagram of a ten transistor pixel architecture circuit similar to that of FIG. 2 but with four storage capacitors per pixel instead of two, in accordance with this disclosure.

Shown in FIG. 3 is an embodiment in which the circuit 10 includes four sample/hold capacitors C1-C4 on the digital wafer 2. Transistors M11-M13, and M14-M16 function like transistors M6, M7, M3, and transistors M8-M10.

There are also four independent bitlines VX0A-VX0D with a single READ1 line to enable them via transistors M3, M10, M13, and M16. However, it is possible to have two bitlines by having an extra READ2 line such that output read transistors (i.e. M3, M10, M13, and M16) which have a common bitline have separate read signals. For example, transistors M3 and M13 may share the bitline VX0A but the gate of transistor M3 gate is connected to READ1, and the gate of transistor M13 is connected to READ2; similarly transistors may M10 and M16 share a common bitline VX0B with the gate of M10 being connected to READ1 and gate of M16 being connected to READ2.

The two extra S/H capacitors C3 and C4 may be co-planar with the existing S/H capacitors C1 and C2, or as will be explained below, by an addition of an extra insulator layer and metal layer in their construction, can be on a separate plane but aligned horizontally with C1 and C2.

Figure 4A:
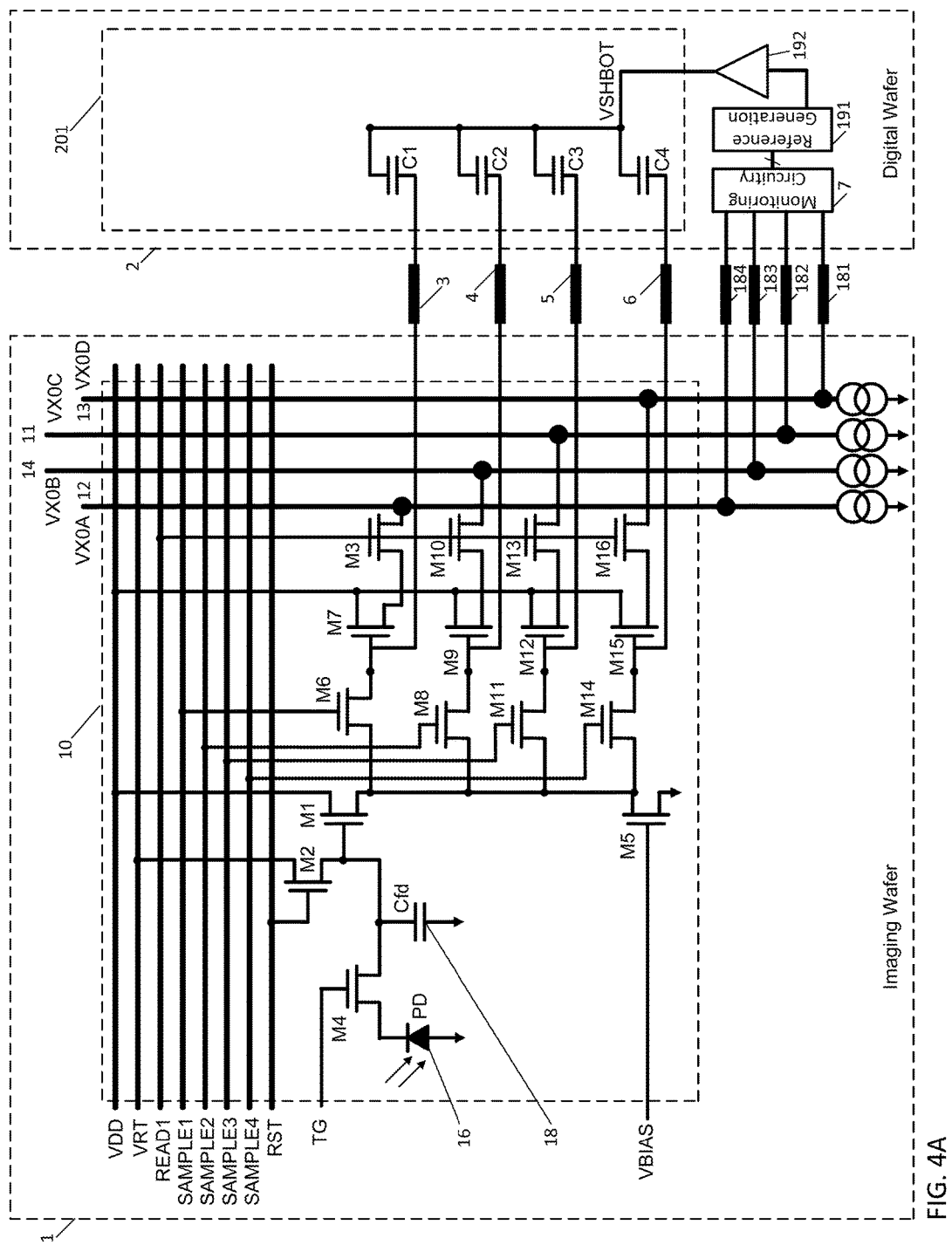
FIG. 4A is a circuit diagram of a ten transistor pixel architecture circuit similar to that of FIG. 3 but with an adjustable reference voltage coupled to a plate of the storage capacitors, with monitoring circuitry for the reference voltage being on the digital IC.

Shown in FIG. 4A is an embodiment in which the reference voltage VSHBOT tied to the capacitors C1-C4 can be adjusted to reduce the voltage across the plates. As the voltage is reduced, it is practical to reduce the thickness of the dielectric of the capacitor without increasing the electric field strength which would otherwise cause breakdown and damage to the insulation. Reducing this thickness increases the capacitance of the S/H capacitance and further improves the pixel performance.

Figure 4B:
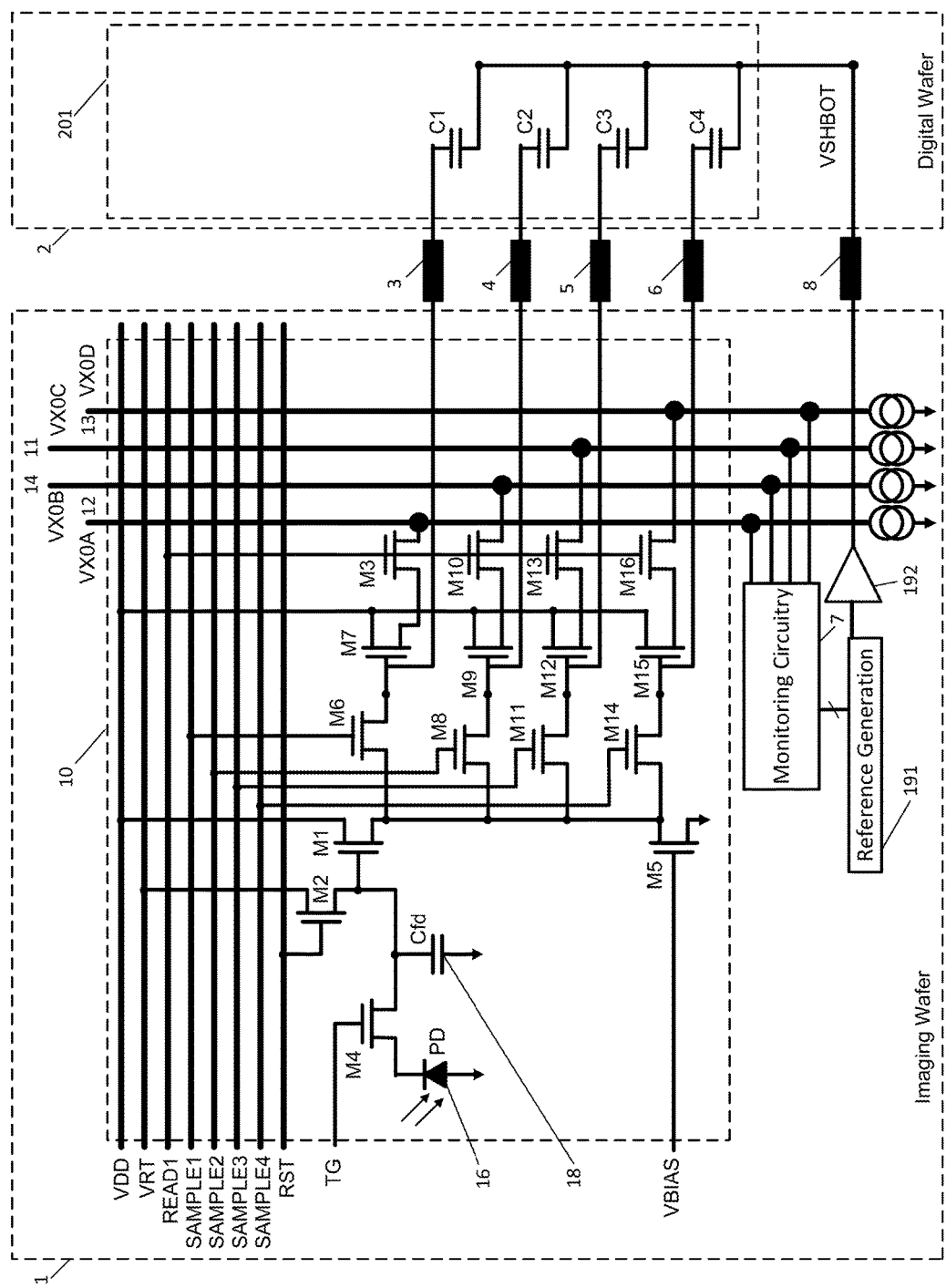
FIG. 4B is a circuit diagram of a ten transistor pixel architecture circuit similar to that of FIG. 3 but with an adjustable reference voltage coupled to a plate of the storage capacitors, with monitoring circuitry for the reference voltage being on the analog IC.

The reference voltage VSHBOT can be at a predetermined voltage or can be adjusted during sensor operation for optimal setting, for example half-way between the black voltage of the photodiode 16 and image voltage stored on the capacitors C1-C4. This could be achieved by monitoring of replica circuit elements which are similar construction to the imaging pixels, but not used during readout. Alternatively VSHBOT could be determined through continuous monitoring of the voltages read out of the pixel array and optimization of this voltage, as shown in FIG. 4A in which the monitoring circuitry 7 is on the digital IC 2, and as shown in FIG. 4B in which the monitoring circuitry 7 is on the analog IC 1. In the case where the monitoring circuitry 7 is on the analog IC 1, an additional conductive bump 8 is used to transfer signals from the monitoring circuitry for control of VSHBOT. The monitoring circuitry 7 may function to convert the monitored voltages to the digital domain, and control VSHOT based upon the converted digital voltages.

Figure 5A:
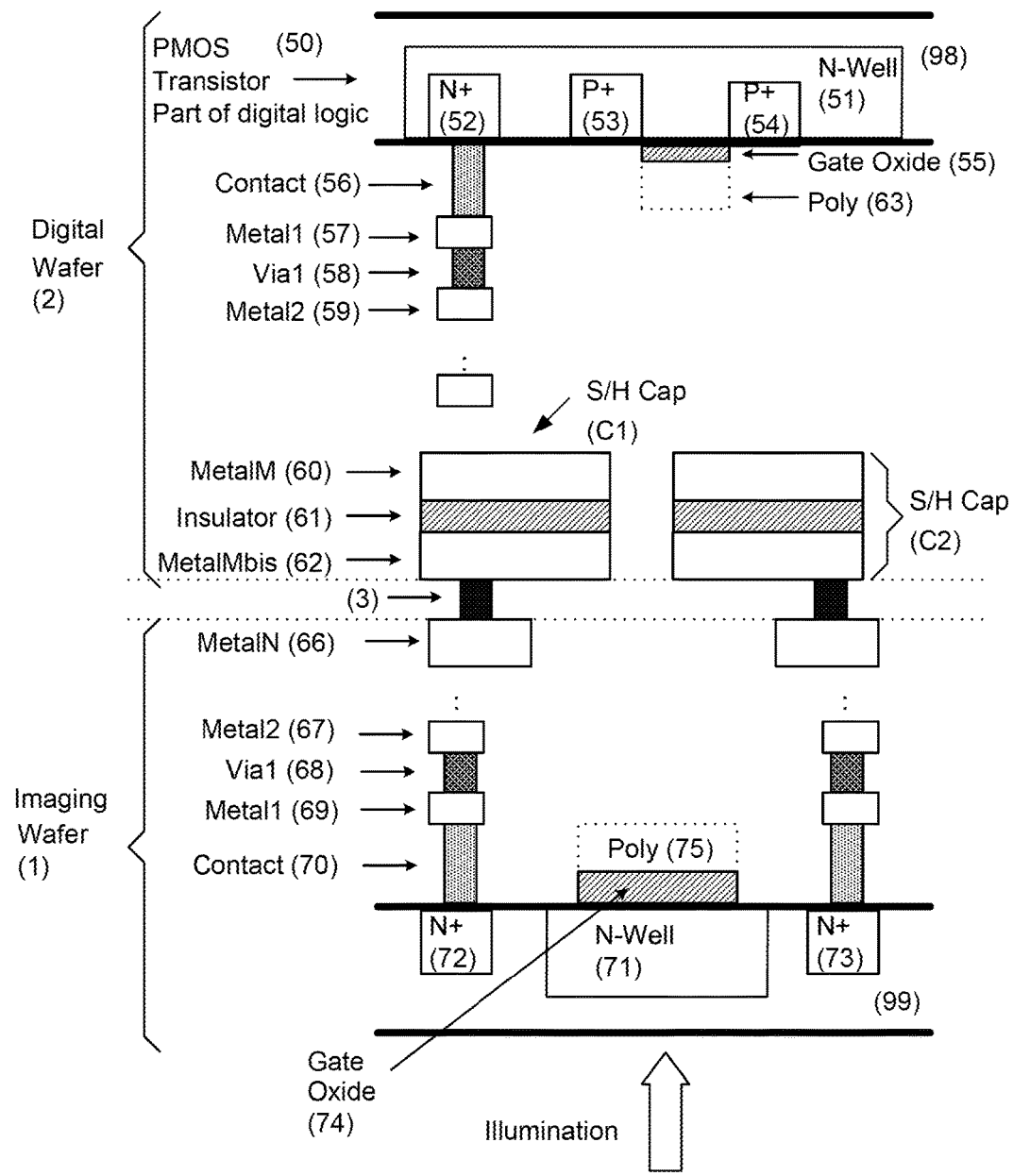
FIG. 5A is a cross sectional view of two capacitors of FIGS. 1A, 2, 3, or 4, in which first plates of the capacitors are exposed on a surface of the digital IC, sources of switch transistors are exposed on a surface of the analog IC, and conductive bumps coupled the digital IC to the analog IC.

Potential layouts for the circuit 10 will now be described, referring initially to FIG. 5A. As explained, the circuit 10a has analog portions embodied in the imaging wafer or IC 1, and digital portions embodied in the digital wafer or IC 2. The imaging wafer 1, as shown, illustrates one of the transistors M6, M8, M11, M14 as including a p-type substrate 99, source 72 and drain 73 regions formed in the substrate 99, and a gate region 71 formed in the substrate 99. A gate oxide 74 is formed above the gate region 71, with a polysilicon layer 75 formed on the gate oxide 74. Contacts 70 within the imaging wafer 1 electrically couple the source 72 and drain 73 regions to first metallizations 69, which are in turn electrically coupled to second metallizations 67 through vias 68. Not shown for brevity are other vias and metallizations which serve to electrically couple the second metallizations 67 to the top metallization layer 66. As shown in this example, the top metallization layer 66 is exposed on a surface of the imaging wafer 1.

As stated, the circuit 10 has digital portions formed in the digital wafer 2. In greater detail, as shown, sample and hold capacitors C1 and C2 include insulators 61 sandwiched between a first conductive plate 62 and second conductive plate 60.

Formed in a vertically spaced apart fashion from the capacitors C1 and C1 is a transistor 50 forming part of a digital logic circuit in the digital wafer. The transistor 50 includes a substrate 98, with an N-well 51 formed therein. Formed within the N-well 51 are the source region 52, drain region 54, and the gate region 53. A gate oxide 55 is formed between the gate region 53 and drain region 54, and a polysilicon layer 63 is formed on the gate oxide 55. Contacts 56 within the digital wafer 2 electrically couple the source 52 and region to first metallizations 57, which are in turn electrically coupled to second metallizations 59 through vias 58. Other vias and metallizations used for interconnection with other transistors to form the digital logic circuits of the digital wafer 2 are not shown for brevity.

The digital wafer 2 and imaging wafer 1 have their respective first capacitor plates 62 and metallizations 66 coupled to one another by conductive bumps 3.

Figure 5B:
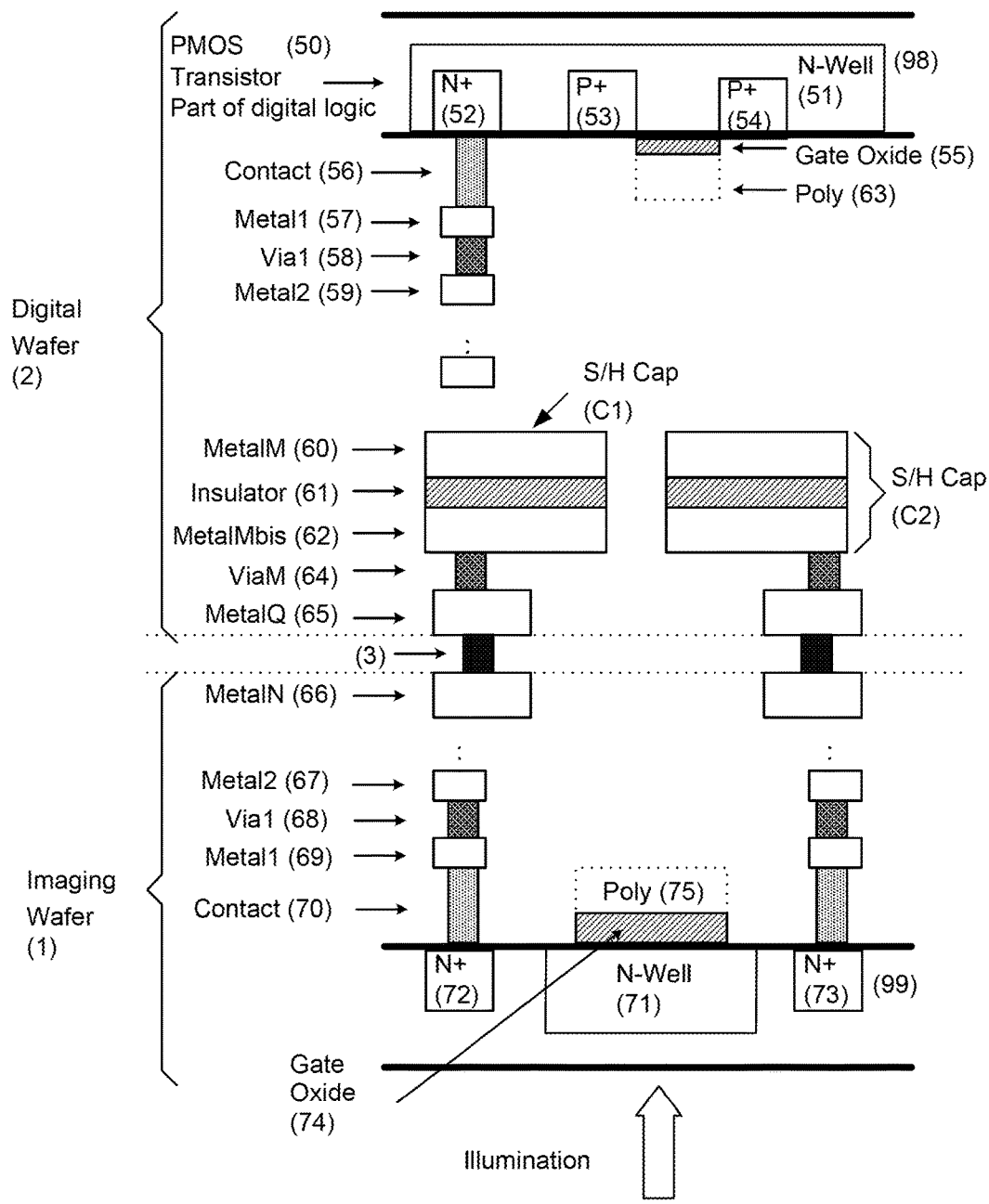
FIG. 5B is a cross sectional view of two capacitors of FIGS. 1A, 2, 3, or 4, similar to that of FIG. 5A, but in which conductive pads are exposed on the surface of the digital IC, and vias coupled the conductive pads to the first plates of the capacitors.

Rather than the first capacitor plates 62 being directly exposed on the surface of the digital wafer 2, as shown in FIG. 5B, additional metallizations 65 may be are exposed on the surface of the digital wafer 2, and vias 64 couple the first capacitor plates 62 to the additional metallizations 65.

Regarding the digital logic circuitry in the digital wafer 2 to which the transistor 50 belongs, that digital logic circuitry may be responsible for processing an acquired image, exposure control, merging of two high-dynamic range images, storing images in a digital format, communications with another device, or any other suitable functions. There may not be a direct correspondence or 1:1 physical relationship between the capacitors C1 and C2 and the area consumed by the digital logic circuitry above or underneath.

As the transistor 50 and other digital logic circuitry is unconnected to the analog voltages of the circuit 10, it may be implemented in a process technology which uses much smaller transistors (which have low breakdown voltages) than used by the imaging wafer. This may provide for excellent digital gate density and allows for sophisticated image processing to be performed on the digital wafer 2, such as image compressing, 3D reconstruction (e.g. if structured light is used for depth mapping), HDR merging, frame store, face detection, iris detection, fingerprint detection, face recognition, face recognition, gesture detection, vein detection, skin blemish detection or even processing unrelated to the image, such as voice recognition, voice synthesis, wireless communication, visible light communication, signal filtering, data fusion, system control, and other image processing techniques.

Figure 6A:
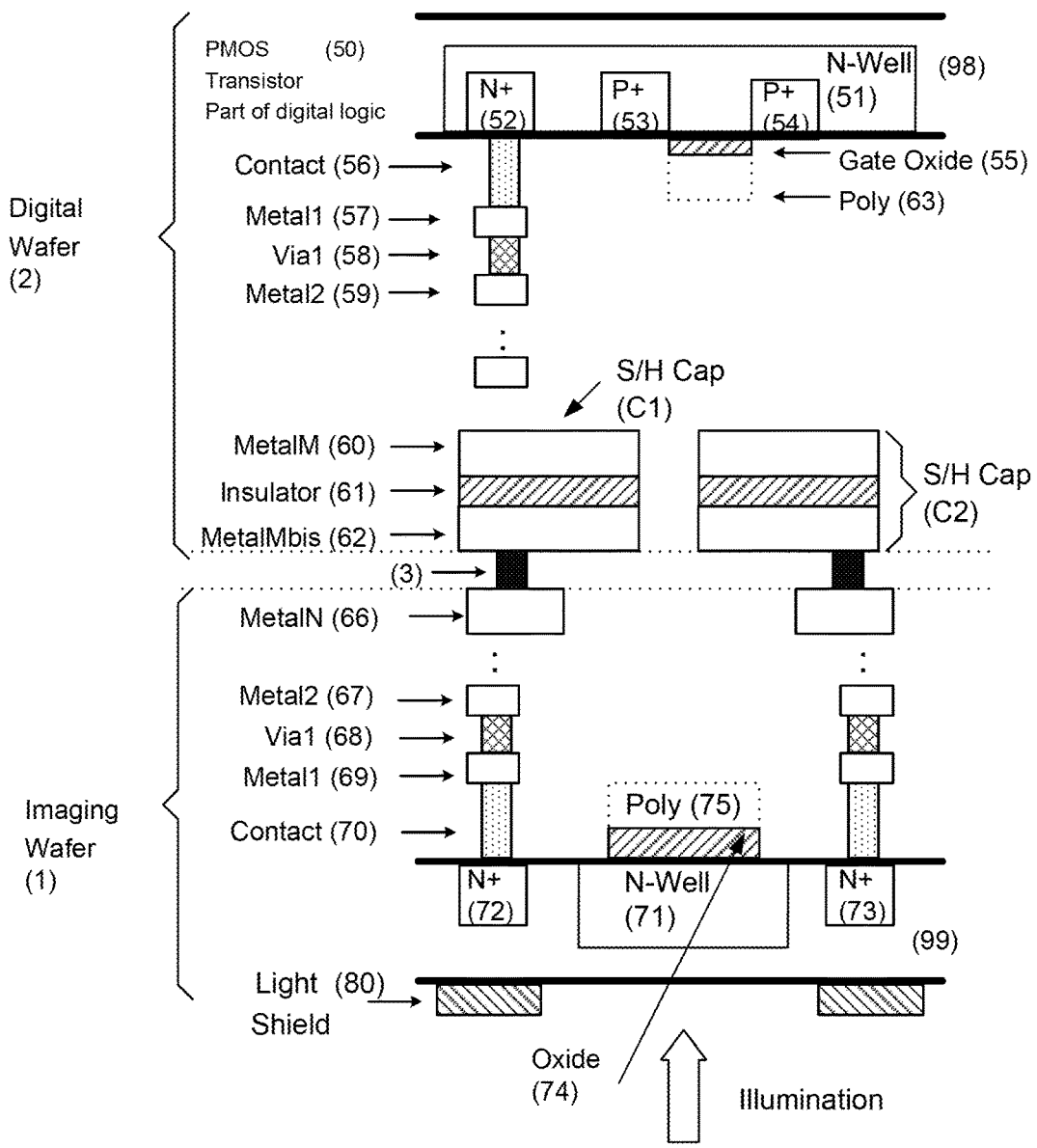
FIG. 6A is a cross sectional view of two capacitors of FIGS. 1A, 2, 3, or 4, similar to that of FIG. 5A, but in which light shields formed on the surface of the analog IC shield portions of the transistors.
Figure 6B:
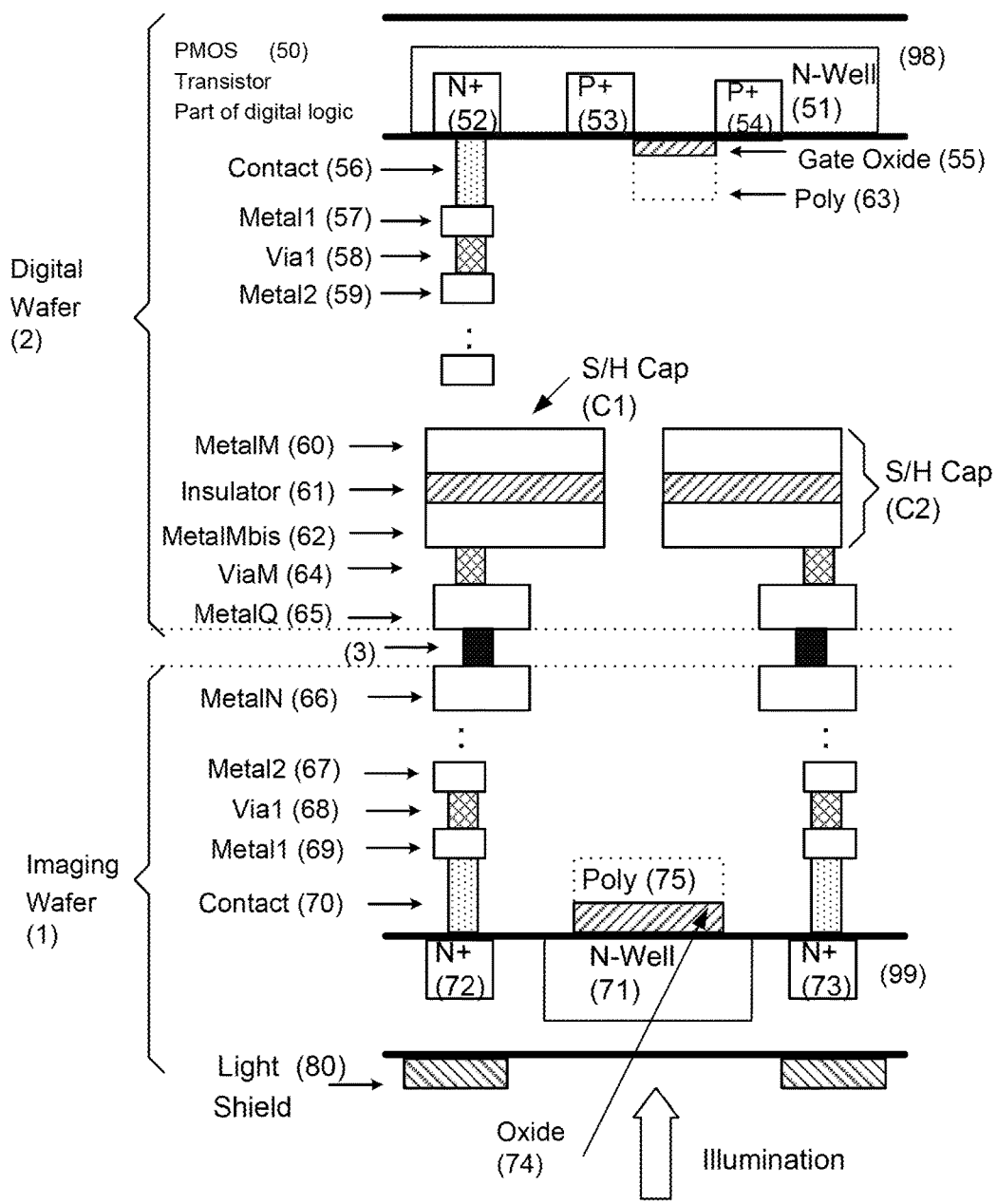
FIG. 6B is a cross sectional view of two capacitors of FIGS. 1A, 2, 3, or 4, similar to that of FIG. 5B, but in which light shields formed on the surface of the analog IC shield portions of the transistors.

One potential drawback of the above layout is that the circuitry 10 on the imaging wafer 1 may be light sensitive, which can lead to degraded performance and potential errors. One way to ward against this is shown in FIGS. 6A and 6B, in which light shields 80 formed from suitable materials are formed on the surface of the imaging wafer 1 over the source region 72 and drain region 73. This light is back-side illumination received on the back surface of the substrate 99.

Figure 7A:
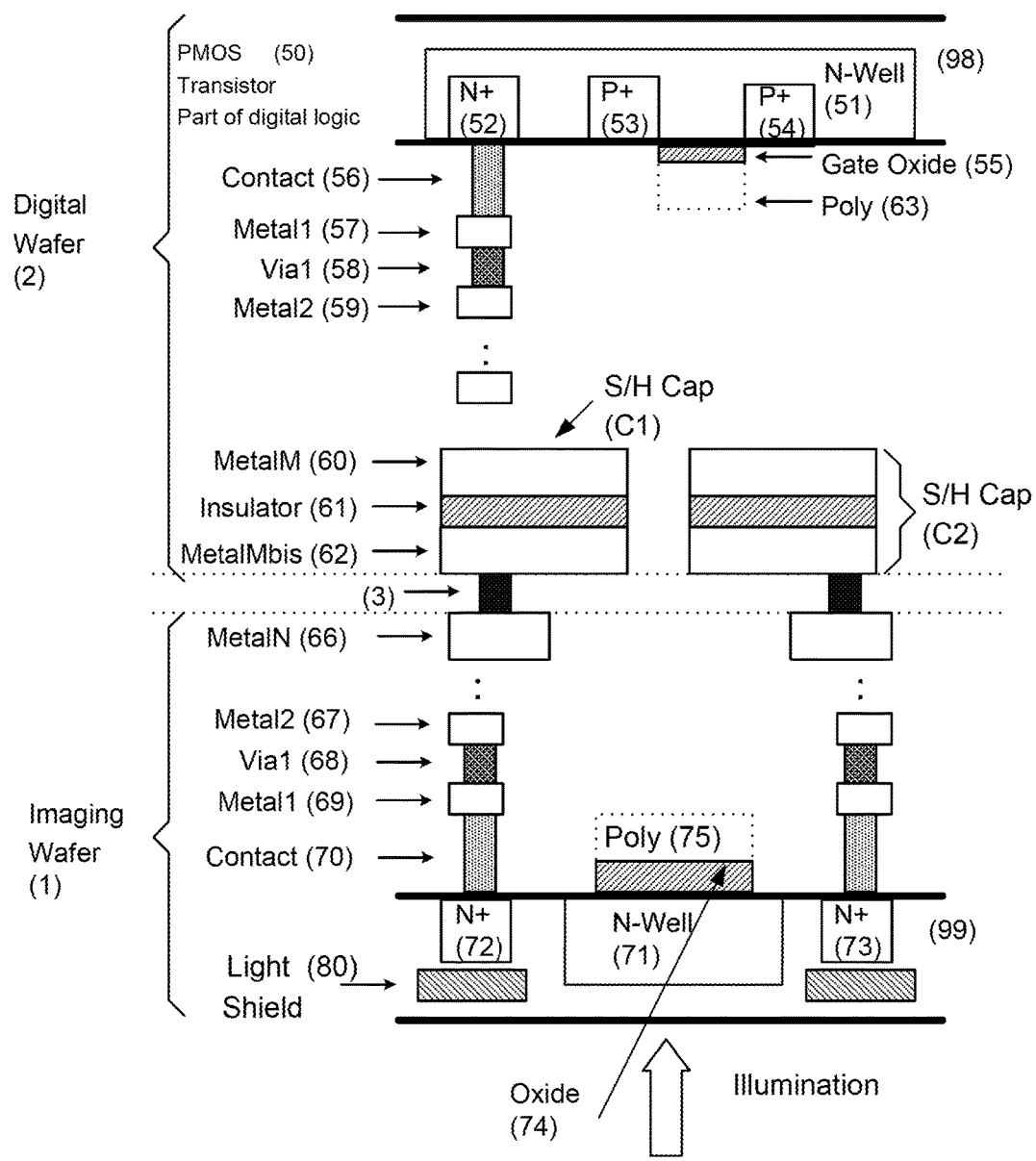
FIG. 7A is a cross sectional view of two capacitors of FIGS. 1A, 2, 3, or 4, similar to that of FIG. 6A, but in which the light shields are formed within the analog IC.
Figure 7B:
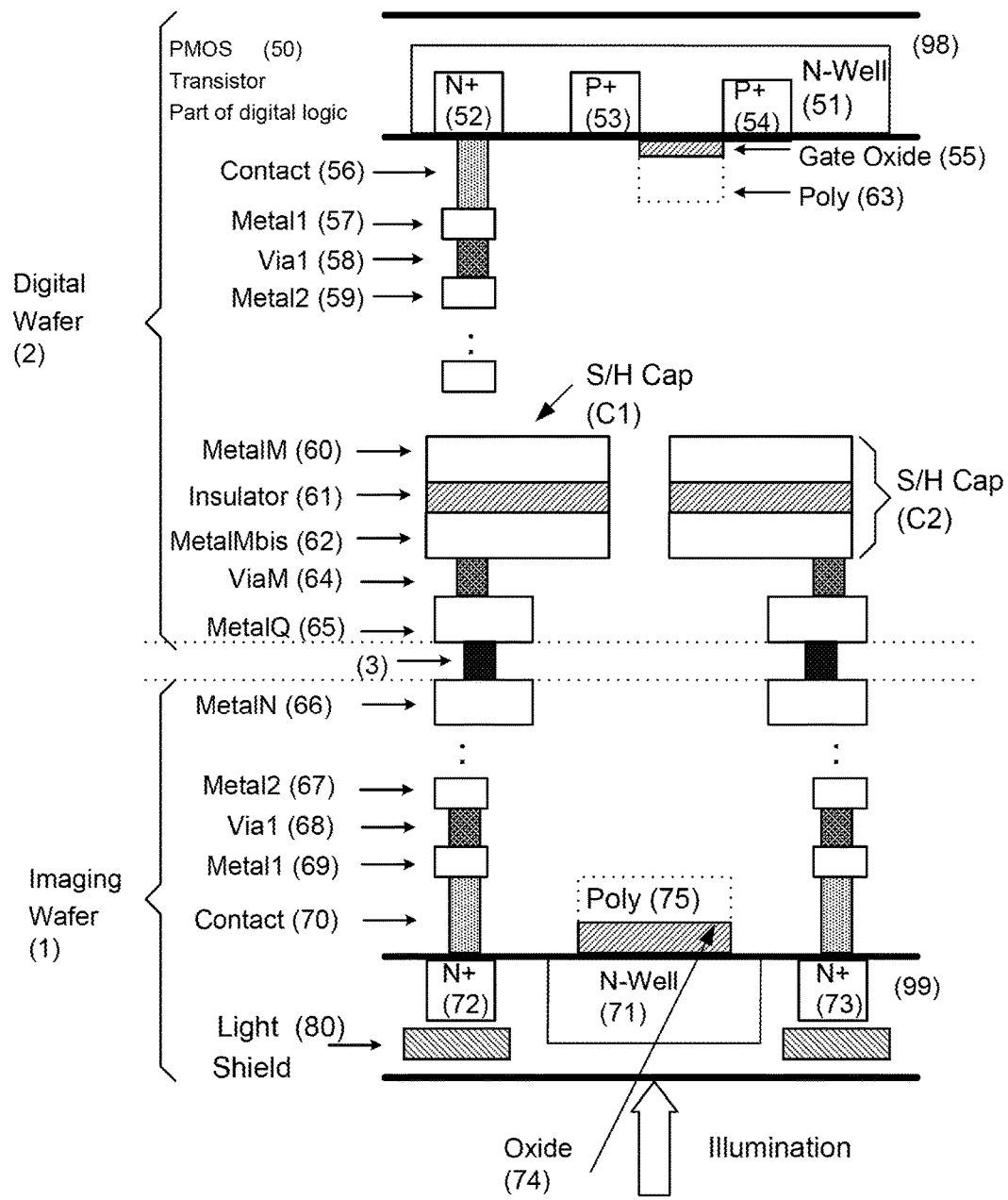
FIG. 7B is a cross sectional view of two capacitors of FIGS. 1A, 2, 3, or 4, similar to that of FIG. 6B, but in which the light shields are formed within the analog IC.

As some photo-generated charge may diffuse or drift in the substrate 99 onto the source region 72 and drain region 73, it may be desirable in some applications for the light shields 80 to instead be formed buried within the substrate 99, as shown in FIGS. 7A and 7B.

The various light shields 80 described above are particularly useful when implemented for switch transistors M6, M11, M14, M9, and M8. In some applications, the various other transistors do not have the light shields 80 present, but at least one of the switch transistors M6, M11, M14, M9, and M8 has the light shields 80 present.

Figure 8A:
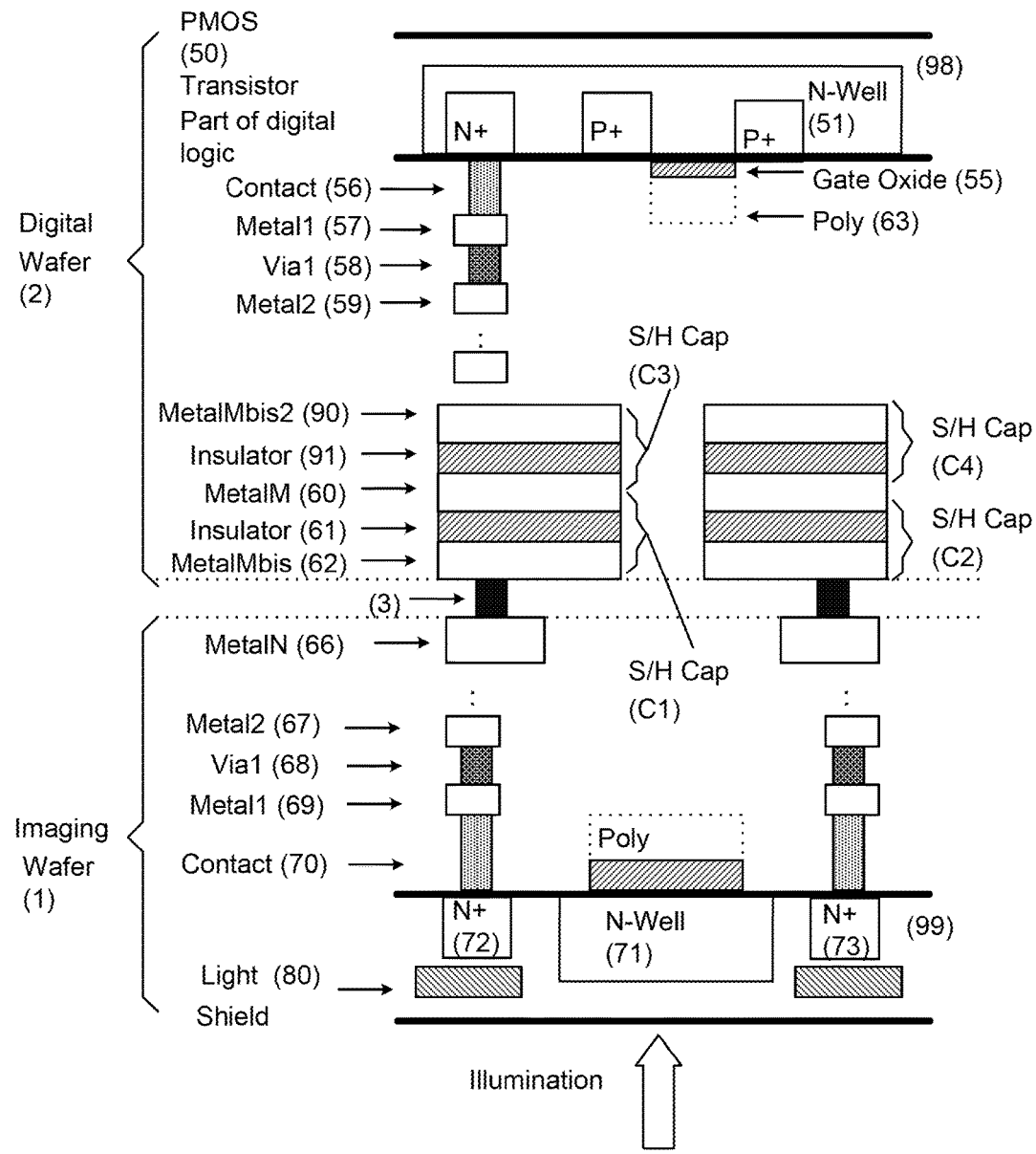
FIG. 8A is a cross sectional view similar to that of FIG. 7A, but in which four capacitors are shown, and in which the four capacitors are formed are two capacitor stacks.
Figure 8B:
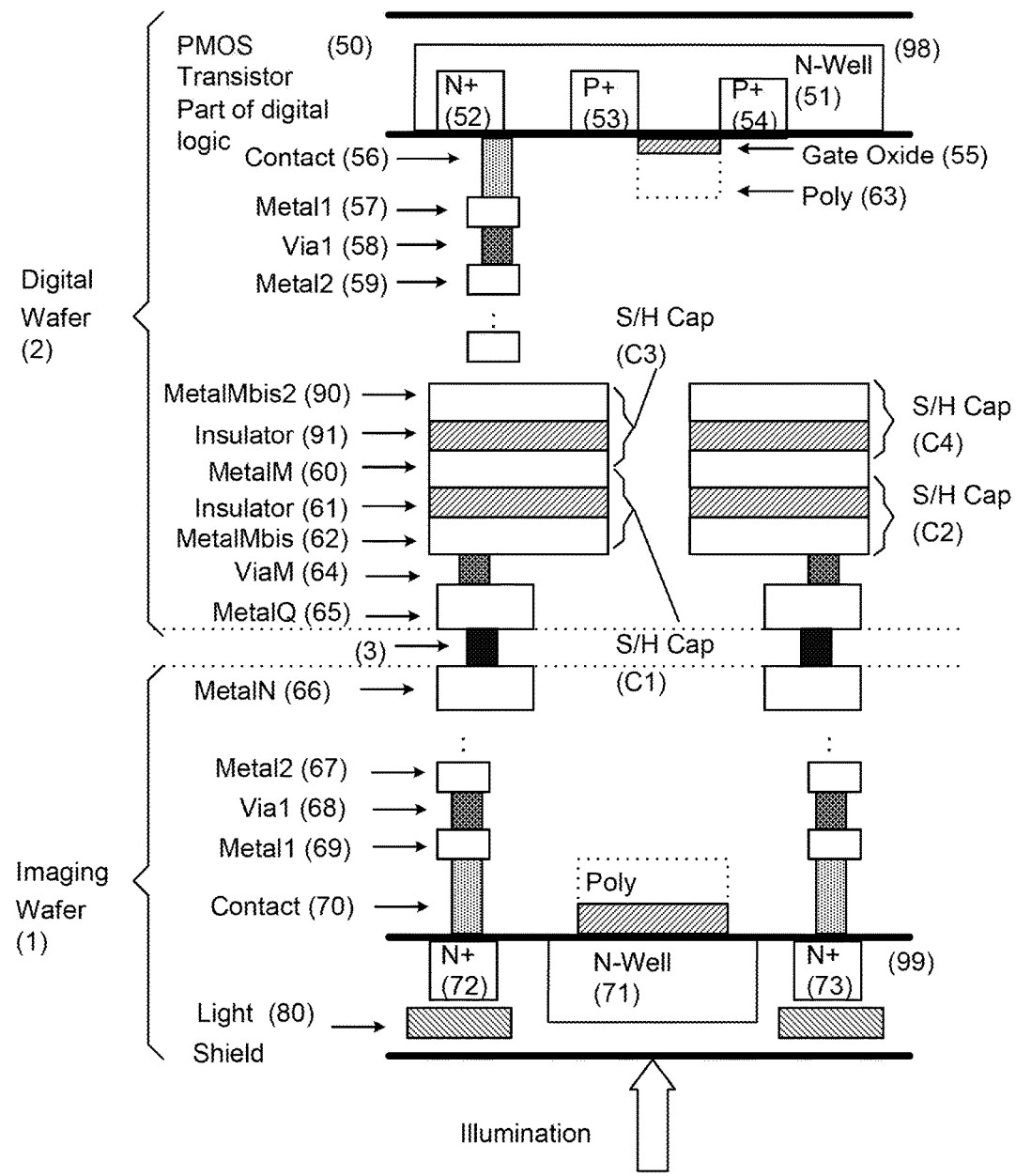
FIG. 8B is a cross sectional view similar to that of FIG. 7B, but in which four capacitors are shown, and in which the four capacitors are formed are two capacitor stacks.

As shown in FIGS. 3 and 4A-4B and described above, there may be four sample and hold capacitors C1-C4. This may be implemented, in some applications as shown in FIGS. 8A-8B, where an additional insulator layer 91 is stacked on the metallizations 60, and additional metallizations 90 are stacked on the additional insulator layer 91. This provides for efficient space savings due to the vertical stacking of the capacitors C1-C4 as well as due to the sharing of metallizations 60 by capacitors C1, C3 and C2, C4, as shown.

One potential top plan layout for at least a portion of the digital wafer 2 is now described with reference to FIG. 9A. This sample implementation is for four pixels, referred to as 00, 01, 10, and 11. There are two capacitors per pixel, labeled as C1P00 and C2P00, for example for the pixel 00. The capacitors C1P00, C2P00, C1P01, C2P01, C1P10, C2P10, C1P11, and C2P11 are surrounded by an insulating guard ring 90, which may be implemented as a deep trench or capacitive deep trench. The guard ring 90 may be connected to the same ground as the second plates of the capacitors C1P00, C2P00, C1P01, C2P01, C1P10, C2P10, C1P11, and C2P11, such as VSHBOT. The guard ring 90 serves to help prevent crosstalk between the capacitors C1P00, C2P00, C1P01, C2P01, C1P10, C2P10, C1P11, and C2P11.

While beneficial, the addition of the guard ring 90 consumes extra surface area and so either reduces the size of the capacitor or increases the surface area utilized. Thus, as shown in FIG. 9B, it may in some cases to not form the guard ring 90.

Figure 9B:
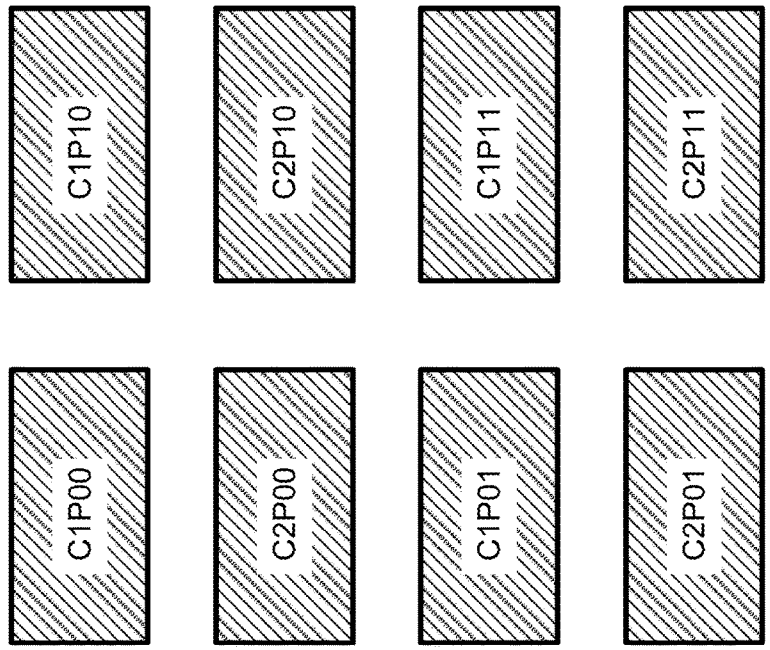
FIG. 9B shows a top plan view of a potential capacitor layout for use on the digital IC of FIGS. 1A, 2, 3, or 4, similar to that of FIG. 9A, but without an isolation region surrounding the capacitors.
Figure 9A:
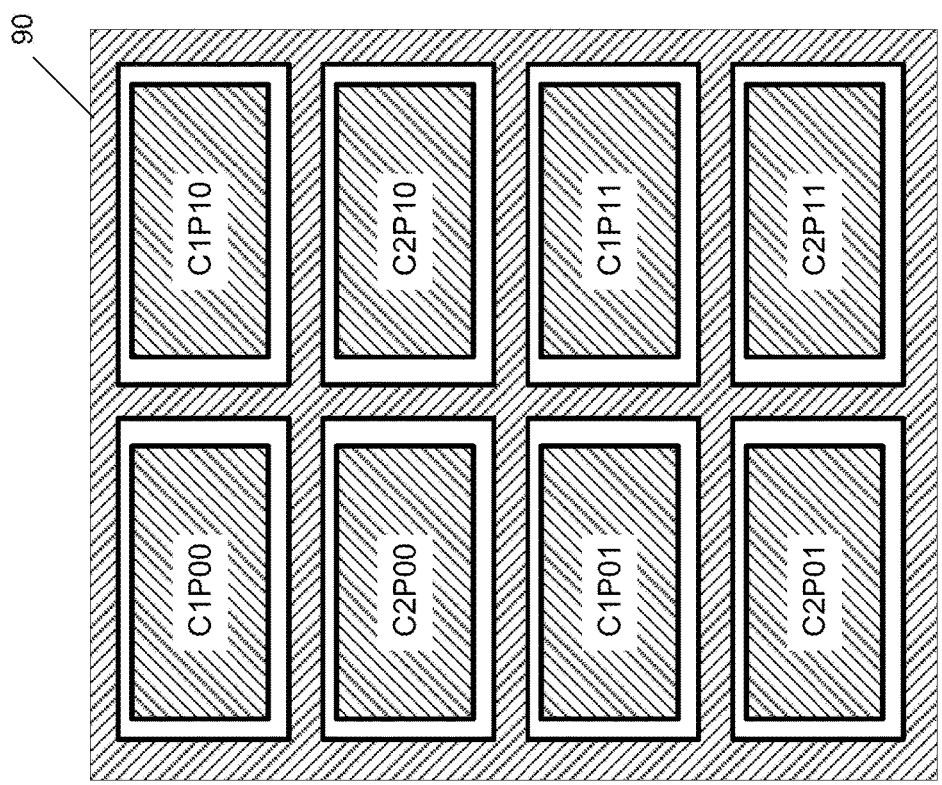
FIG. 9A shows a top plan view of a potential capacitor layout for use on the digital IC of FIGS. 1A, 2, 3, or 4, in which an isolation region surrounds the capacitors.
Figure 9C:
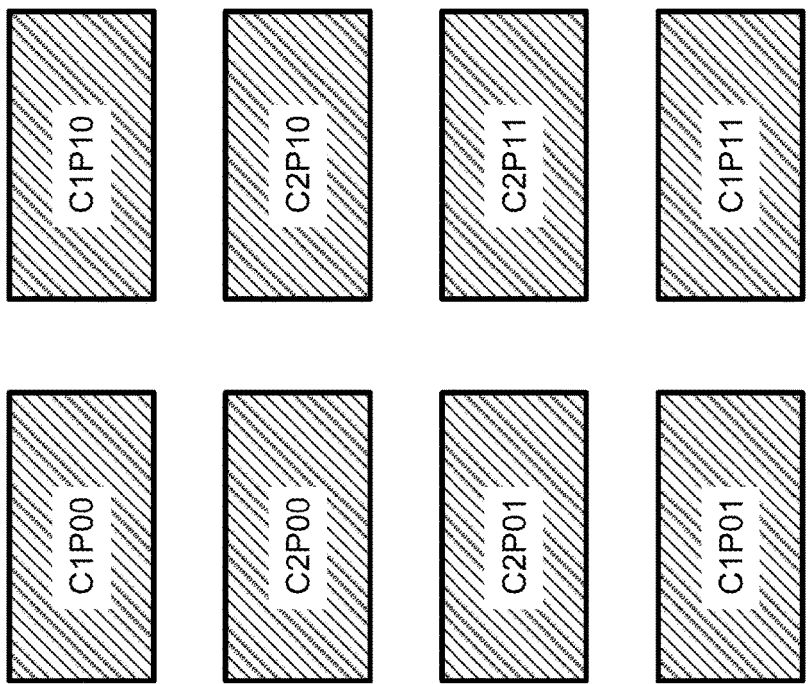
FIG. 9C shows a top plan view of a different capacitor layout for use on the digital IC of FIGS. 1A, 2, 3, and 4.

Another application is shown in FIG. 9C, in which C2P00 is adjacent to C2P10 and C2P01, and has but one adjacent side to a C1 capacitor C1P00 instead of both C1P00 and C1P10 capacitors as show in FIG. 9B. Grouping the C1 capacitors together, and the C2 capacitors together, is beneficial because where a global shutter arrangement is implemented, C2 capacitors are typically driven simultaneously, and so while there is a same electrical capacitance between C2P00 and C2P01, the effect is reduced as they are driven simultaneously. This applies to the C1 capacitors as well.

It should be understood that the prior teachings are in no way limited to the specific transistor and capacitor structures shown, and that this disclosure contemplates any and all types of transistor and capacitor structures.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
a first integrated circuit die having formed therein at least one photodiode, read circuitry for the at least one photodiode, and readout circuitry for the first integrated circuit die, wherein the read circuitry has an input coupled to the at least one photodiode and an output, wherein the readout circuitry has an input coupled to the output of the read circuitry and an output;
a second integrated circuit die in a stacked arrangement with the first integrated circuit die and having formed therein at least one storage capacitor associated with the at least one photodiode; and
an interconnect between the first and second integrated circuit dies for coupling the output of the read circuitry to the at least one storage capacitor;
wherein the output of the readout circuitry provides for readout of data stored in the at least one storage capacitor.

2. The electronic device of claim 1, wherein the first integrated circuit die has a semiconductor substrate with front and back surfaces, and a series of metallization layers on the front surface to thereby define a top surface; wherein the second integrated circuit die has a semiconductor substrate with front and back surfaces, and a series of metallizations on the front surface to thereby define a top surface; and wherein the top surfaces of the first and second integrated circuit die face one another, and are electrically coupled to each other through the interconnect.

3. The electronic device of claim 1, wherein the first integrated circuit die lacks any digital circuitry; and wherein the second integrated circuit die lacks analog circuitry other than the at least one storage capacitor.

4. The electronic device of claim 1, wherein the interconnect comprises at least one conductive bump.

5. The electronic device of claim 1, wherein the at least one storage capacitor comprises a metal-insulator-metal capacitor.

6. The electronic device of claim 1, wherein the second integrated circuit die also has formed therein a transistor of a logic circuit.

7. The electronic device of claim 6, wherein the at least one storage capacitor is formed in a capacitor layer of the second integrated circuit die; wherein the logic circuit is formed in a logic circuit layer of the second integrated circuit die; and wherein the capacitor layer and the logic circuit layer are vertically separated within the second integrated circuit die in a stacked arrangement.

8. The electronic device of claim 1, wherein the at least one storage capacitor comprises, in a stacked arrangement, a first metal layer, an insulator layer on the first metal layer, and a second metal layer on the insulator layer.

9. The electronic device of claim 8, wherein at least a portion of the first metal layer is exposed on a surface of the second integrated circuit die; wherein the at least one photodiode has a conduction terminal exposed on a surface of the first integrated circuit die in an aligned fashion with the portion of the first metal layer exposed on the surface of the second integrated circuit die; and wherein the interconnect electrically couples the portion of the first metal layer exposed on the surface of the second integrated circuit die to the conduction terminal exposed on the surface of the first integrated circuit die.

10. The electronic device of claim 8, wherein the second integrated circuit die further comprises at least one contact pad exposed on a surface thereof, and at least one via coupling the at least one contact pad to the first metal layer of the at least one storage capacitor; wherein the at least one photodiode has a conduction terminal exposed on a surface of the first integrated circuit die in an aligned fashion with the at least one contact pad exposed on the surface of the second integrated circuit die; and wherein the interconnect electrically couples the at least one contact pad exposed on the surface of the second integrated circuit die to the conduction terminal exposed on the surface of the first integrated circuit die.

11. The electronic device of claim 1, wherein the first integrated circuit die has a shield layer formed thereon containing at least one shielding structure configured to shield a light sensitive portion of the readout circuitry from light impinging on the first integrated circuit die.

12. The electronic device of claim 8, further comprising at least one additional storage capacitor formed within the second integrated circuit die; wherein the at least one additional storage capacitor comprises a second insulating layer on the second metal layer, and a third metal layer on the second insulating layer.

13. The electronic device of claim 1, wherein the first integrated circuit die has a shield layer formed therein containing at least one shielding structure configured to shield a light sensitive portion of the readout circuitry from light impinging on the first integrated circuit die.

14. The electronic device of claim 1, wherein the readout circuitry of the first integrated circuit die further comprises an analog to digital converter formed in the second integrated circuit die and configured to convert analog pixel values generated based on the at least one photodiode to digital pixel values, the analog to digital converter being coupled to the at least one storage capacitor.

15. The electronic device of claim 1, wherein the second integrated circuit die has formed therein at least one isolation region surrounding the at least one storage capacitor in a spaced apart relationship therewith.

16. The electronic device of claim 1, wherein the at least one photodiode and the readout circuitry are coupled to a first reference voltage; and wherein the at least one storage capacitor is coupled to a second reference voltage.

17. The electronic device of claim 16, wherein the second reference voltage has a different value than the first reference voltage.

18. The electronic device of claim 17, further comprising control circuitry within the second integrated circuit die configured to adjust the second reference voltage to be one half a difference between an output voltage of the at least one photodiode which indicates a lack of light impinging thereon and a voltage stored across the at least one storage capacitor.

19. The electronic device of claim 18, further comprising monitoring circuitry within the second integrated circuit die to directly monitor the voltage stored across the at least one storage capacitor, and to provide the monitored voltage to the control circuitry.

20. An electronic device, comprising:
a first integrated circuit die having formed therein photodiodes, read circuitry for the photodiodes, and readout circuitry for the first integrated circuit die, wherein the read circuitry for the photodiodes includes input pads and output pads exposed on a surface of the first integrated circuit die, the input pads of the read circuitry being coupled to the photodiodes;
a second integrated circuit die having formed therein storage capacitor structures for the photodiodes and digital circuitry for performing image processing on data stored in the storage capacitor structures, wherein the storage capacitor structures include input pads exposed on a surface of the second integrated circuit die;
wherein the first and second integrated circuit die are in a face to face arrangement such that the output pads of the read circuitry of the first integrated circuit die face the input pads of the second integrated circuit die;
an interconnect coupling the output pads of the read circuitry of the first integrated circuit die to the input pads of the second integrated circuit die;
wherein the readout circuitry for the first integrated circuit die has an input coupled to the storage capacitor structures and an output providing for readout of data stored in the storage capacitor structures.

21. The electronic device of claim 20, wherein the first integrated circuit die lacks any digital circuitry; and wherein the second integrated circuit die lacks analog circuitry.

22. The electronic device of claim 20, wherein the storage capacitor structures are formed within a first layer of the second integrated circuit die; wherein the digital circuitry is formed within a second layer of the second integrated circuit die; and wherein the first and second layers of the second integrated circuit die are vertically separated within the second integrated circuit die in a stacked arrangement.

23. The electronic device of claim 20, wherein the storage capacitor structures each comprise, in a stacked arrangement, a first metal layer, an insulator layer on the first metal layer, and a second metal layer on the insulator layer.

24. The electronic device of claim 23, wherein portion of the first metal layers are exposed on a surface of the second integrated circuit die as the input pads.

25. The electronic device of claim 23, wherein the storage capacitor structures comprise vias coupling the first metal layers to the input pads.

26. The electronic device of claim 23, further comprising at least one additional storage capacitor formed within the second integrated circuit die; wherein the at least one additional storage capacitor comprises a second insulating layer on the second metal layer, and a third metal layer on the second insulating layer.

27. The electronic device of claim 20, wherein the first integrated circuit die has a shield layer formed thereon containing at least one shielding structure configured to shield a light sensitive portion of the readout circuitry from light impinging on the first integrated circuit die.

28. The electronic device of claim 20, wherein the first integrated circuit die has a shield layer formed therein containing at least one shielding structure configured to shield a light sensitive portion of the readout circuitry from light impinging on the first integrated circuit die.

29. The electronic device of claim 1, wherein the readout circuitry further comprises a transistor configured to act as a source follower; and wherein the input of the readout circuitry is a gate of the source follower transistor.

30. The electronic device of claim 1, wherein the second integrated circuit die further comprises an analog to digital converter entirely contained within; and wherein the output of the readout circuitry is coupled to the analog to digital converter via the interconnect.

31. The electronic device of claim 30, wherein the first integrated circuit die lacks any analog to digital conversion circuitry.

32. The electronic device of claim 20, wherein the second integrated circuit die comprises an analog to digital converter entirely contained within; and wherein the output of the readout circuitry for the first integrated circuit die is coupled to the analog to digital converter via the interconnect.

33. The electronic device of claim 32, wherein the first integrated circuit die lacks any analog to digital conversion circuitry.

* * * * *